United States Patent
Oh

[19]

[11] Patent Number: 5,959,356
[45] Date of Patent: Sep. 28, 1999

[54] SOLDER BALL GRID ARRAY CARRIER PACKAGE WITH HEAT SINK

[75] Inventor: Sang Eon Oh, Seongnam, Rep. of Korea

[73] Assignee: Samsung Electronics Co., Ltd., Suwon, Rep. of Korea

[21] Appl. No.: 08/953,381

[22] Filed: Oct. 17, 1997

Related U.S. Application Data

[63] Continuation of application No. 08/755,098, Nov. 25, 1996, abandoned.

[30]    Foreign Application Priority Data

Nov. 25, 1995  [KR]   Rep. of Korea ...................... 95-43760

[51] Int. Cl.⁶ ........................... H01L 23/48; H01L 23/52; H01L 29/40
[52] U.S. Cl. ........................... 257/738; 257/737; 257/706
[58] Field of Search .................................. 257/737, 738, 257/675, 796, 673, 688, 706, 707, 720

[56]              References Cited

U.S. PATENT DOCUMENTS

| | | | |
|---|---|---|---|
| 4,835,598 | 5/1989 | Higuchi et al. ......................... | 257/675 |
| 4,893,172 | 1/1990 | Matsumoto et al. ..................... | 257/668 |
| 4,954,878 | 9/1990 | Fox et al. .................................. | 257/675 |
| 5,103,290 | 4/1992 | Temple et al. ........................... | 257/738 |
| 5,159,434 | 10/1992 | Kohno et al. ............................ | 257/668 |
| 5,182,628 | 1/1993 | Izawa et al. . | |
| 5,216,278 | 6/1993 | Lin et al. ................................. | 257/673 |
| 5,433,822 | 7/1995 | Mimura et al. .......................... | 257/737 |
| 5,455,456 | 10/1995 | Newman ................................. | 257/704 |
| 5,468,999 | 11/1995 | Lin et al. ................................. | 257/738 |
| 5,583,747 | 12/1996 | Baird et al. ............................. | 257/738 |
| 5,598,036 | 1/1997 | Ho ........................................... | 257/738 |
| 5,598,321 | 1/1997 | Mostafazadeh et al. ............... | 257/707 |

FOREIGN PATENT DOCUMENTS

| | | | |
|---|---|---|---|
| 60-242653 | 12/1985 | Japan ..................................... | 257/675 |
| 04348061 | 12/1992 | Japan ..................................... | 257/675 |

OTHER PUBLICATIONS

Marks et al "Stacked Thermally Enhanced High Package Density Module", IBM Tech. Dis. Bull., vol. 23, No. 11, Apr. 1981, p. 4835.

*Primary Examiner*—Olik Chaudhuri
*Assistant Examiner*—Phat X. Cao
*Attorney, Agent, or Firm*—Jones Volentine, LLP

[57]                ABSTRACT

A solder ball grid array carrier package has a circuit board with conductive wirings and a plurality of through holes. At least one semiconductor chip is mounted on an upper surface of the circuit board and bonding wires electrically connect the chip to the conductive wirings. A plurality of solder balls are electrically connected to the conductive wirings, with the solder balls being adhered to a lower surface of the circuit board. A heat sink is also adhered to the lower surface of the circuit board. The heat sink is in direct contact with the through holes of the circuit board, with the through holes allowing for heat dissipation.

11 Claims, 2 Drawing Sheets

SOLDER BALL GRID ARRAY CARRIER PACKAGE WITH HEAT SINK

This application is a continuation of application Ser. No. 08/755,098 filed Nov. 25, 1996, now abandoned.

BACKGROUND OF THE INVENTION

1. Filed of the Invention

The present invention relates generally to a solder ball grid array carrier package, and in particular to a solder ball grid array carrier package which permits easy alignment and attachment of solder balls to a carrier substrate, a strong adhesion between the solder balls and the carrier substrate, and efficient heat dissipation. The package also prevents delamination of an electronic component such as a chip from a die pad.

2. Description of the Related Art

Semiconductor devices used in electronic systems face continuing requirements for faster operation and smaller sizes. These requirements are more important for small electronic systems such as sub-lap top personal computers and personal digital assistants (PDAs). As the miniaturization trend continues, the operational voltage for these portable or personal electronic systems decreases. For example, for CMOS DRAMs, the Vcc supply voltage has been reduced from 5.0V to 3.3V or 2.8V over the past few years. Also, as the operational speed of electronic devices has increased and the operational voltage has decreased, the power consumption of the device has increased, indicating that more heat is generated during the operation of these devices. More efficient heat dissipation, therefore, becomes an important factor in determining the performance and life cycle of an electronic apparatus.

For microprocessors, such as a central processing unit (CPU), or synchronous random access memory devices, heat removal from electronic devices is carried out by a heat sink or heat spreader.

FIG. 1 is a cross-sectional view of a conventional ball grid array carrier package provided with a top heat sink, which is disclosed in the U.S. Pat. No. 5,216,278. The ball grid array carrier is a surface mount device having a low profile and high pin count. The device can be fabricated in plastic which offers a cost savings compared to other high pin count package materials such as ceramic and the like. Moreover, it has an advantage over other pin grid array carrier packages in that it has a lead design employing shorter lead lengths, contributing to a reduction in the inductance.

With reference to FIG. 1, the conventional ball grid array carrier package 1 comprises a semiconductor chip 3 attached to a die pad 4 on a chip mounting surface of a carrier substrate such as a circuit board 2. The circuit board 2 is formed with wirings 5 made from a conductive material, for example copper. The wirings 5 are connected to bonding pads 7 on the chip 3 through bonding wires 6. The wirings 5 transverse signal via holes 8 formed in the circuit board 2 to extend to a package mount surface 9 of the circuit board 2, i.e., the surface on the other side of the chip mounted surface.

The extended wirings 5 contact signal solder balls 10 so that the solder ball array carrier package 1 can transmit and receive various information to and from an electronic system onto which the package is mounted. A solder resist 11 is formed for several reasons, including providing easy and correct alignment of the solder balls, insulation between the wirings, protection of the wirings from various shocks, and an improved adhesion of the solder balls to the wirings.

A thermal coupling layer 12 is formed on an upper surface of the chip 3, and is contact with a heat sink 13 placed thereon. The heat sink or heat spreader 13 transfers heat generated from the chip 3 to top of the package. The thermal coupling layer 12 can be an aluminum filled silicone, aluminum nitride, a copper oxide filled silicone, or the like.

Thermal via holes 14 are filled with a thermally conductive fill material such as a metal filled epoxy or lead-tin solder, or the like, which makes contact to die pad 4. Thermal solder balls 15 are attached to the thermal via holes 14. To enhance their heat dissipation capability, the thermal solder balls 15 are distributed on the package mounting surface in a depopulated area where no signal solder balls 10 are formed. The thermal solder balls 15 can be made large compared to signal solder balls 10, thereby increasing the thermal mass available for heat transfer. Further, a solder alloy having a composition yielding a large heat transfer coefficient, such as a 63:37 lead-tin alloy, can be used to fabricate the thermal solder balls 15. In the solder ball array carrier package 1 shown in FIG. 1, heat removal from semiconductor chip 3 is accomplished upward through heat sink 13 as well downward through the thermal via holes 14.

Nevertheless, recent studies have shown that ball grid array carrier packages have inferior reliability. In ball grid array carrier packages, the semiconductor chip is mounted on a gold-plated die pad. The reliability tests highlight a problem associated with delamination or dislocation of the chip from the die pad, although epoxy molding compounds strongly adhere to solder resists. To avoid this problem, it has been proposed to split the die pad into two or more pieces. Although a pad-less package may be used to enhance the adhesion force of the chip to the circuit board, it is practically difficult because adhesive materials used to attach the chip to the circuit board can flow through the thermal via holes.

Another problem associated with ball grid array carrier packages is that it is very difficult to precisely and correctly align the signal solder balls 10 to the solder ball pads under circuit board 2 and firmly adhere the solder balls to their pads. Solder balls thus frequently detach from their pads. Although the detached solder balls can be re-soldered by a reflow process, it causes an increase in the stress on the solder balls and eventually an increase in package failures.

SUMMARY OF THE INVENTION

Accordingly, an object of the invention is to provide a ball grid array carrier package that permits efficient heat dissipation while preventing delamination of a semiconductor chip from a die pad.

Another object of the invention is to provide a ball grid array carrier package which allows precise alignment of solder balls and a strong adhesion of the solder balls to a carrier substrate.

These objects can be accomplished by a solder ball grid array carrier package, comprising: a circuit board having conductive wirings formed thereon, and a plurality of through holes for heat dissipation; at least one semiconductor chip mounted on an upper surface of the circuit board; bonding wires for electrically connecting the chip to the conductive wirings; a plurality of solder balls electrically connected to the conductive wirings, the solder balls being adhered to a lower surface of the circuit board; and a heat sink adhered to the lower surface of the circuit board, said heat sink being in direct contact with the plurality of through holes of the circuit board.

BRIEF DESCRIPTION OF THE DRAWINGS

These and various other features and advantages of the present invention will be readily understood with reference

DETAILED DESCRIPTION OF THE INVENTION

The present invention will now be described in more detail with reference to the accompanying drawings.

Figure 1:
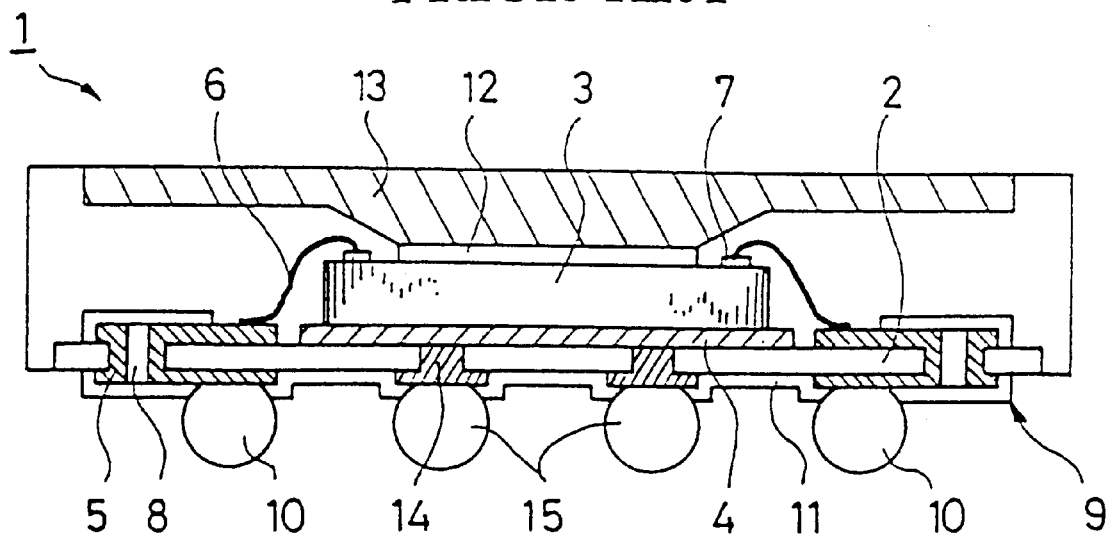
FIG. 1 is a cross-sectional view of a conventional ball grid array carrier package having a top heat sink and heat dissipation through holes.
Figure 2:
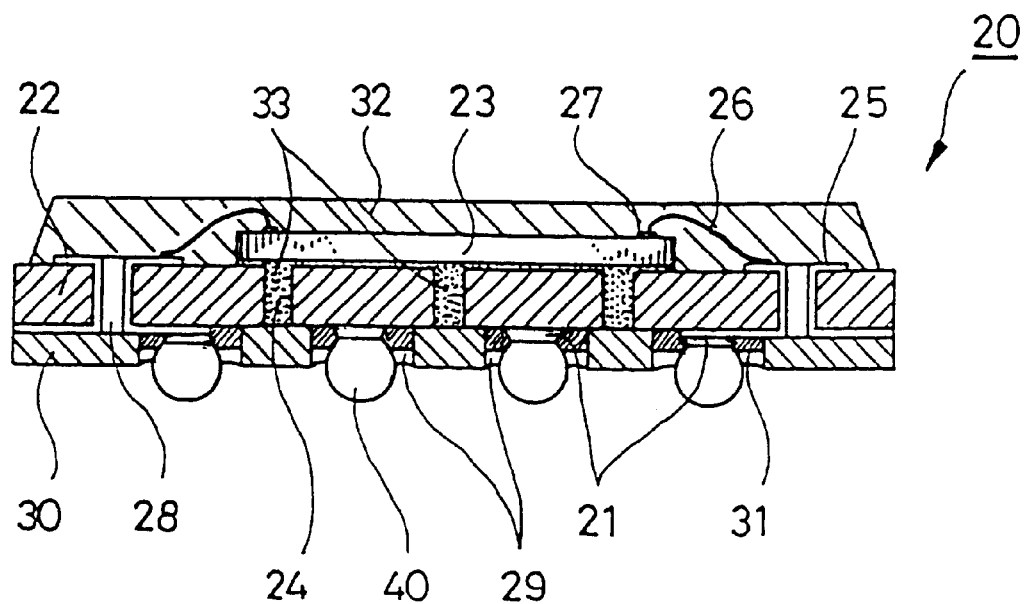
FIG. 2 is a cross-sectional view of a ball grid array carrier package having a bottom heat sink under a circuit substrate according to the present invention.

FIG. 2 is a cross-sectional view of a solder ball grid array carrier package 20 according to the present invention. Circuit board 22 is formed with conductive wirings 25, through which electrical signals are transmitted, signal vias 28, and thermal vias 24. Semiconductor chip 23 is mounted on a die attach surface of the circuit board 22, in this case the upper surface, through a thermally conductive adhesive 33. The thermally conductive adhesive 33 applied on the upper surface also fills the thermal vias 24 and then contacts the heat sink 30. The heat sink 30 is adhered to the lower surface of the circuit board 22. Accordingly, heat can be removed rapidly and efficiently from semiconductor chip 23 to the outside of the package through adhesive 33, and then heat sink 30.

Conductive wirings 25 on circuit board 22 are electrically connected to bonding pads 27 on semiconductor chip 23 through bonding wires 26. The conductive wirings 25 transverse signal vias 28 and extend to the lower surface of circuit board 22 where they are coupled to solder balls 40 so that the wirings can be electrically connected to an electronic system to which the solder ball array carrier package is mounted. As stated above, heat sink 30 is adhered to the lower surface, i.e., the surface opposite to the chip attach surface, of circuit board 22. Solder ball pads 21 are formed before the solder balls 40 are attached thereto. Then, the solder balls 40 are placed on solder resists 31 and joined thereto by a reflow process.

Although not shown in the accompanying drawings for simplification, it is understood that circuit board 22 comprises a plurality of wiring layers formed with copper conductive patterns. Electrical connections between the solder balls 40 and the chip 23 are accomplished by these wiring layers. The wirings 25 are one of the plurality of wiring layers.

With a circuit board 22 comprised of multiple wiring layers, a conductive pattern layer connected to ground is usually formed as an internal layer. In such a case, by connecting the grounded conductive pattern layer to heat sink 30 through thermal vias 24, and connecting the grounded solder balls 40 to the heat sink 30, the power supply can be stabilized. In addition, electrical noise generated during high speed operations can be significantly reduced. Furthermore, according to the present invention, since semiconductor chip 23 is directly attached to circuit board 22 by way of adhesive 33 without an interposing die pad, stronger adherence of the chip to the circuit board can be attained.

Figure 3:
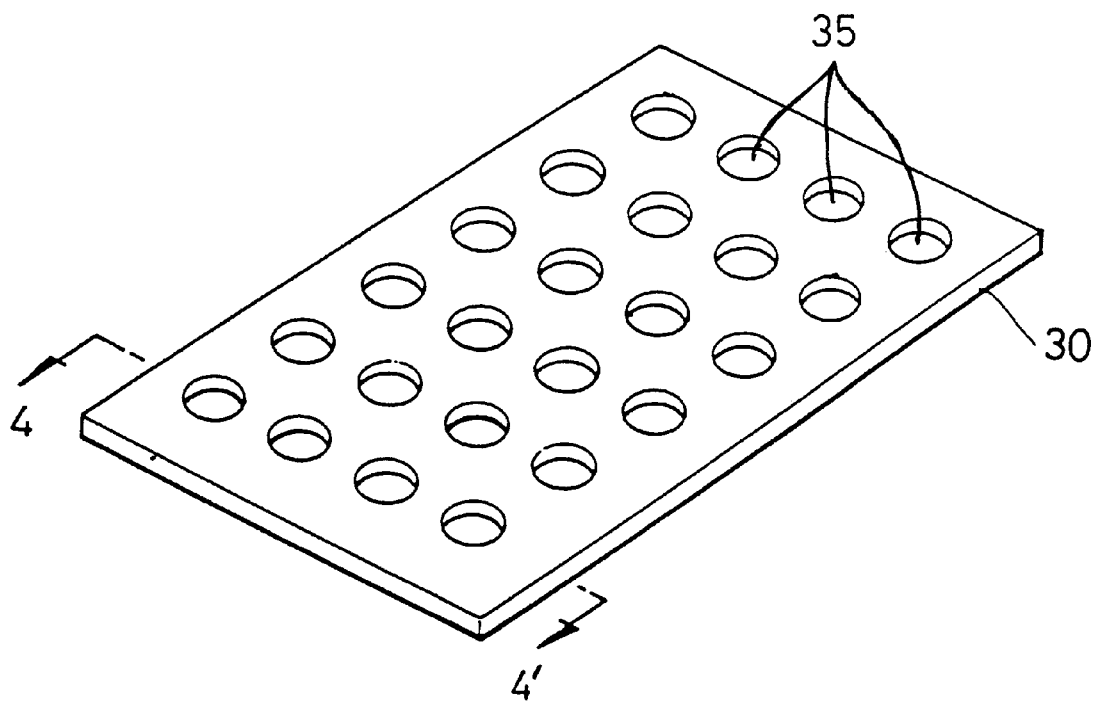
FIG. 3 is a perspective view illustrating the structure of the heat sink according to the present invention.

FIG. 3 is a perspective view of heat sink 30 employed with the solder ball array carrier package 20. Heat sink 30 is formed with a plurality of through holes 35, with each hole 35 being capable of receiving a solder ball 40. The hole 35 has a larger diameter than solder ball 40. As shown in FIG. 2, the diameter of the holes 35 should be larger than that of solder balls 40, because heat sink 30 must be electrically insulated from the solder balls 40. The holes 35 are filled with an insulating material such as silicone 29. The number of holes in heat sink 35 depends on the number of solder balls 40 required for transmitting signals. It can be seen in FIG. 2 that the smaller the number of holes, the greater the amount of surface area of heat sink 30 that is in contact with thermal via holes 24.

Figure 4:
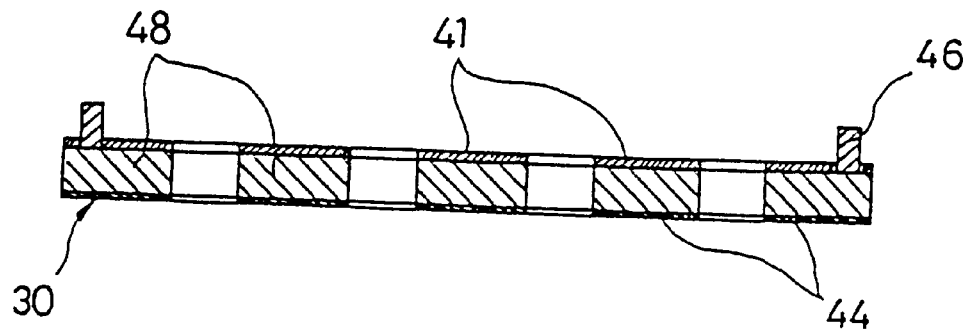
FIG. 4 is a cross-sectional view illustrating a multi layer structure of the heat sink according to the present invention.

FIG. 4 is a cross-sectional view of the heat sink of FIG. 3, taken along the line 4–4'. Heat sink 30 includes an adhesive layer 41, a thermal coupling layer 48, and an optional ink layer 44. The thermal coupling layer 48 is preferably made from a good thermally and electrically conductive material, for example, copper alloy or iron alloy (e.g., "alloy 42"), which is usually used as a material for lead frames. Adhesive layer 41 is used to adhere heat sink 30 to a lower surface of the circuit board and may be composed of an epoxy resin.

The lower surface of heat sink 30 may be coated with a black ink 44 in order to improve the distinction between the solder balls and the lower surface of the heat sink, when a mounting apparatus mounts the ball gird array carrier package to an electronic system. Further, the heat sink 30 may be provided with guide bars 46 for the purpose of easier mounting of heat sink 30 to the circuit board.

As described above, according to the ball grid array carrier package of the present invention, since the solder balls are fitted into the holes in a heat sink that is placed under the circuit board, a plurality of solder balls can be easily and precisely placed on solder resist pads in the holes. In such a case, the solder balls rarely detach from the solder resist, even after repeated thermal or physical shocks.

Further, for the ball grid array carrier package of the present invention, since it does not employ a die pad to attach a semiconductor chip to the circuit board, the adhesion of the chip to the board is greatly improved. Moreover, thermal via holes formed in circuit board located between the chip and heat sink render more efficient heat dissipation.

Although preferred embodiments of the present invention have been described in detail hereinabove, it should be clearly understood that many variations and/or modifications of the basic inventive concepts herein taught, which may appear to those skilled in the art, still fall within the spirit and scope of the present invention as defined in the appended claims.

What is claimed is:

1. A solder ball grid array carrier package, comprising:
    a circuit board having conductive wirings formed thereon, and a plurality of heat dissipation through holes;
    at least one semiconductor chip mounted on an upper surface of the circuit board and being in contact with the plurality of heat dissipation through holes;
    bonding wires for electrically connecting the chip to the conductive wirings;
    a plurality of signal solder balls electrically connected to the conductive wirings, the signal solder balls being adhered to a lower surface of the circuit board, with certain ones of the plurality of signal solder balls being positioned directly below a perimeter of the semiconductor chip; and a heat sink adhered to the lower surface of the circuit board, the heat sink simultaneously surrounding each of the plurality of signal solder balls and directly contacting the plurality of heat dissipation through holes of the circuit board.

2. The solder ball grid array carrier package of claim 1, wherein said semiconductor chip is directly attached to the upper surface of the circuit board using a thermally conductive adhesive.

3. The solder ball grid array carrier package of claim 1, wherein said heat sink has a plurality of openings formed therein corresponding to said plurality of solder balls, whereby the solder balls are placed within the holes.

4. The solder ball grid array carrier package of claim 1, wherein said heat sink is composed of a thermally and electrically conductive material.

5. The solder ball grid array carrier package of claim 1, wherein said heat sink is comprised of a thermal coupling layer and an adhesive layer formed on said thermal coupling layer.

6. The solder ball grid array carrier package of claim 5, wherein said thermal coupling layer is made from a copper alloy.

7. The solder ball grid array carrier package of claim 5, wherein said thermal coupling layer is made from an iron-nickel alloy.

8. The solder ball grid array carrier package of claim 5, wherein a lower surface of said thermal coupling layer is coated with ink.

9. The solder ball grid array carrier package of claim 3, wherein each of said plurality of holes in the heat sink have a diameter larger than that of the respective solder ball.

10. The solder ball grid array carrier package of claim 3, wherein said plurality of holes in the heat sink are filled with an insulating material.

11. The solder ball grid array carrier package of claim 2, wherein said thermally conductive adhesive is also electrically conductive.

* * * * *